(12) United States Patent
Hua et al.

(10) Patent No.: US 11,784,620 B2
(45) Date of Patent: *Oct. 10, 2023

(54) ADAPTIVE DEGENERATION CIRCUITS

(71) Applicant: SKYWORKS SOLUTIONS, INC., Irvine, CA (US)

(72) Inventors: Xingyi Hua, Thousand Oaks, CA (US); Weiheng Chang, Thousand Oaks, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/592,913

(22) Filed: Feb. 4, 2022

(65) Prior Publication Data

US 2022/0255521 A1 Aug. 11, 2022

Related U.S. Application Data

(63) Continuation of application No. 17/005,244, filed on Aug. 27, 2020, now Pat. No. 11,245,372.

(60) Provisional application No. 62/894,051, filed on Aug. 30, 2019.

(51) Int. Cl.
*H03G 3/30* (2006.01)
*H03F 3/24* (2006.01)
*H04B 1/44* (2006.01)

(52) U.S. Cl.
CPC .......... *H03G 3/3042* (2013.01); *H03F 3/245* (2013.01); *H04B 1/44* (2013.01); *H03F 2200/294* (2013.01); *H03F 2200/451* (2013.01); *H03G 2201/103* (2013.01); *H03G 2201/307* (2013.01)

(58) Field of Classification Search
CPC .......... H03G 1/0029; H03G 2201/103; H03G 2201/307; H03G 3/3036; H03G 3/3042; H03F 1/26; H03F 1/56; H03F 2200/111; H03F 2200/294; H03F 2200/451; H03F 2200/489; H03F 2200/525;
(Continued)

(56) References Cited

U.S. PATENT DOCUMENTS 10,110,166 B1 * 10/2018 Noori ............... H03B 5/1215
11,245,372 B2 * 2/2022 Hua .................. H03F 1/56
2008/0012643 A1 1/2008 Duperray
(Continued)

OTHER PUBLICATIONS

Non-Final Rejection for U.S. Appl. No. 17/005,244, dated Jun. 9, 2021, 9 pages.
(Continued)

*Primary Examiner* — Nguyen T Vo
(74) *Attorney, Agent, or Firm* — Chang & Hale LLP

(57) ABSTRACT

This disclosure relates to variable-gain amplifiers that include degeneration circuits configured to adapt to a gain mode that is currently being implemented. For example, a variable-gain amplifier can operate in a plurality of gain modes to amplify a signal with different levels of amplification. The variable-gain amplifier can include a gain circuit configured to amplify a signal and a degeneration circuit coupled to the gain circuit. The degeneration circuit can include an inductor and a switching-capacitive arm coupled in parallel to the inductor. The degeneration circuit can operate based on a current gain mode to change an inductance for the variable-gain amplifier.

19 Claims, 10 Drawing Sheets

(58) Field of Classification Search
CPC .. H03F 2203/7209; H03F 3/195; H03F 3/245; H03F 3/72; H04B 1/0483; H04B 1/44
See application file for complete search history.

(56) References Cited

U.S. PATENT DOCUMENTS

| | | | |
|---|---|---|---|
| 2016/0336983 A1* | 11/2016 | Wang | H04B 1/0458 |
| 2018/0062690 A1 | 3/2018 | Hageraats et al. | |
| 2018/0175807 A1* | 6/2018 | Noori | H03F 1/56 |
| 2018/0191312 A1 | 7/2018 | Mu | |
| 2019/0267951 A1 | 8/2019 | Kim et al. | |
| 2020/0328724 A1 | 10/2020 | Ayranci et al. | |
| 2021/0083636 A1* | 3/2021 | Chang | H03F 1/565 |

OTHER PUBLICATIONS

Notice of Allowance for U.S. Appl. No. 17/005,244, dated Sep. 23, 2021, 6 pages.

* cited by examiner

ADAPTIVE DEGENERATION CIRCUITS

CROSS-REFERENCE TO RELATED APPLICATIONS

This application is a continuation of U.S. application Ser. No. 17/005,244, filed Aug. 27, 2020 and entitled "Variable-Gain Amplifier with Degeneration Circuit," which claims priority to U.S. Provisional Application No. 62/894,051, filed Aug. 30, 2019 and entitled "Variable-Gain Amplifier with Degeneration Circuit," the entire contents of both are incorporated herein by reference.

BACKGROUND

Field

The present disclosure relates to the field of amplifiers.

Description of Related Art

Wireless communication devices often include a front-end module that is configured to amplify signals. For example, a front-end module can receive a signal via an antenna, use a low noise amplifier to amplify the signal to a desired level, and pass the amplified signal onto another component. Since the received signal can be associated with many signal strengths, the low noise amplifier can implement a variety of gain modes to provide an output signal that is associated with a relatively consistent signal level. To implement such gain modes, the front-end module includes many inductors and other components in a variety of configurations. This occupies substantial area on the front-end module.

SUMMARY

In accordance with some implementations, the present disclosure relates to a variable-gain amplifier comprising: a gain circuit configured to amplify a signal and to operate in a plurality of gain modes; and a degeneration circuit coupled to the gain circuit. The degeneration circuit includes an inductor and a switching-capacitive arm coupled in parallel to the inductor. The degeneration circuit is configured to operate based at least in part on a gain mode from among the plurality of gain modes.

In some embodiments the switching-capacitive arm includes a capacitor and a switch coupled in series. The switch may include one or more of a transistor and a mechanical switch. In some embodiments, the switching-capacitive arm is a first switching-capacitive arm and the degeneration circuit further includes a second switching-capacitive arm coupled in parallel to the inductor.

In some embodiments, the gain circuit includes a transistor having a gate or base coupled to an input node and a drain or collector coupled to an output node, and the degeneration circuit is coupled to a source or emitter of the transistor. Further, in some embodiments, the switching-capacitive arm is configured to be placed in an open state when the gain mode is a first gain mode and to be placed in a closed state when the gain mode is a second gain mode. The first gain mode may be associated with more gain than the second gain mode. In some embodiments, the variable-gain amplifier is implemented within a low noise amplifier.

In accordance with some implementations, the present disclosure relates to a variable-gain amplifier comprising: a transistor including a gate or base coupled to an input node and a drain or collector coupled to an output node; and a degeneration circuit coupled to a source or emitter of the transistor. The degeneration circuit includes an inductor and a switching-capacitive arm coupled in parallel to the inductor.

In some embodiments, the switching-capacitive arm includes a capacitor and a switch coupled in series. The switch may include one or more of a transistor or a mechanical switch. In some embodiments, the switching-capacitive arm is a first switching-capacitive arm and the degeneration circuit further includes a second switching-capacitive arm coupled in parallel to the inductor.

In some embodiments, the switching-capacitive arm is configured to be in an open state when the variable-gain amplifier is in a first gain mode and to be in a closed state when the variable-gain amplifier is in a second gain mode. The first gain mode may be associated with more gain than the second gain mode. In some embodiments, the variable-gain amplifier is implemented within a low noise amplifier.

In accordance with some implementations, the present disclosure relates to a radio-frequency module comprising: a low noise amplifier configured to amplify a first signal; a power amplifier configured to amplify a second signal; and a controller coupled to at least one of the low noise amplifier or the power amplifier. The controller is configured to control a plurality of gain modes for the radio-frequency module. At least one of the low noise amplifier or the power amplifier includes a transistor and a degeneration circuit coupled to the transistor. The transistor includes a gate or base coupled to an input node and a drain or collector coupled to an output node. The degeneration circuit includes an inductor and a switching-capacitive arm coupled in parallel to the inductor. The degeneration circuit is configured to operate based at least in part on a gain mode from among the plurality of gain modes.

In some embodiments, the controller is configured to control the switching-capacitive arm based at least in part on the gain mode. Further, in some embodiments, the controller is configured to place the switching-capacitive arm in an open state when the selected gain mode is a first gain mode and to place the switching-capacitive arm in a closed state when the selected gain mode is a second gain mode. The first gain mode may be associated with more gain than the second gain mode. In some embodiments, the switching-capacitive arm includes a capacitor and a switch coupled in series.

In accordance with some implementations, the present disclosure relates to a radio-frequency device comprising: a low noise amplifier configured to amplify a first signal; a power amplifier configured to amplify a second signal; a controller coupled to at least one of the low noise amplifier or the power amplifier; and an antenna configured to receive the first signal and transmit the second signal. The controller is configured to control a plurality of gain modes for the radio-frequency device. At least one of the low noise amplifier or the power amplifier includes a transistor and a degeneration circuit coupled to the transistor. The transistor includes a gate or base coupled to an input node and a drain or collector coupled to an output node. The degeneration circuit includes an inductor and a switching-capacitive arm coupled in parallel to the inductor. The degeneration circuit is configured to operate based at least in part on a gain mode from among the plurality of gain modes.

In some embodiments, the controller is configured to place the switching-capacitive arm in an open state when the selected gain mode is a first gain mode and to place the switching-capacitive arm in a closed state when the selected gain mode is a second gain mode. Further, in some embodiments, the switching-capacitive arm includes a capacitor and a transistor coupled in series.

For purposes of summarizing the disclosure, certain aspects, advantages, and/or features of the disclosure have been described. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of the disclosure. In addition, various features of different disclosed embodiments can be combined to form additional embodiments, which are part of this disclosure. Throughout the drawings, reference numbers may be reused to indicate correspondence between reference elements.

DETAILED DESCRIPTION

This disclosure relates to variable-gain amplifiers that include degeneration circuits configured to adapt to a gain mode that is currently being implemented. For example, a variable-gain amplifier can operate in a plurality of gain modes to amplify a signal with different levels of amplification. The variable-gain amplifier can include a gain circuit configured to amplify a signal and a degeneration circuit coupled to the gain circuit. The degeneration circuit can include an inductor and a switching-capacitive arm coupled in parallel to the inductor. The degeneration circuit can operate based on a current gain mode to change an inductance for the variable-gain amplifier. For example, the switching-capacitive arm can be enabled or disabled to change a degeneration inductance for the different gain modes of the variable-gain amplifier. The switching-capacitive arm can include one or more capacitors and/or one or more switches configured to enable or disable the one or more capacitors. Since a capacitor occupies less area than an inductor, the degeneration circuits discussed herein can conserve area on a device (e.g., a front-end module, semiconductor die, or other device), in comparison to other solutions that implement many inductors in various configurations.

Figure 1:
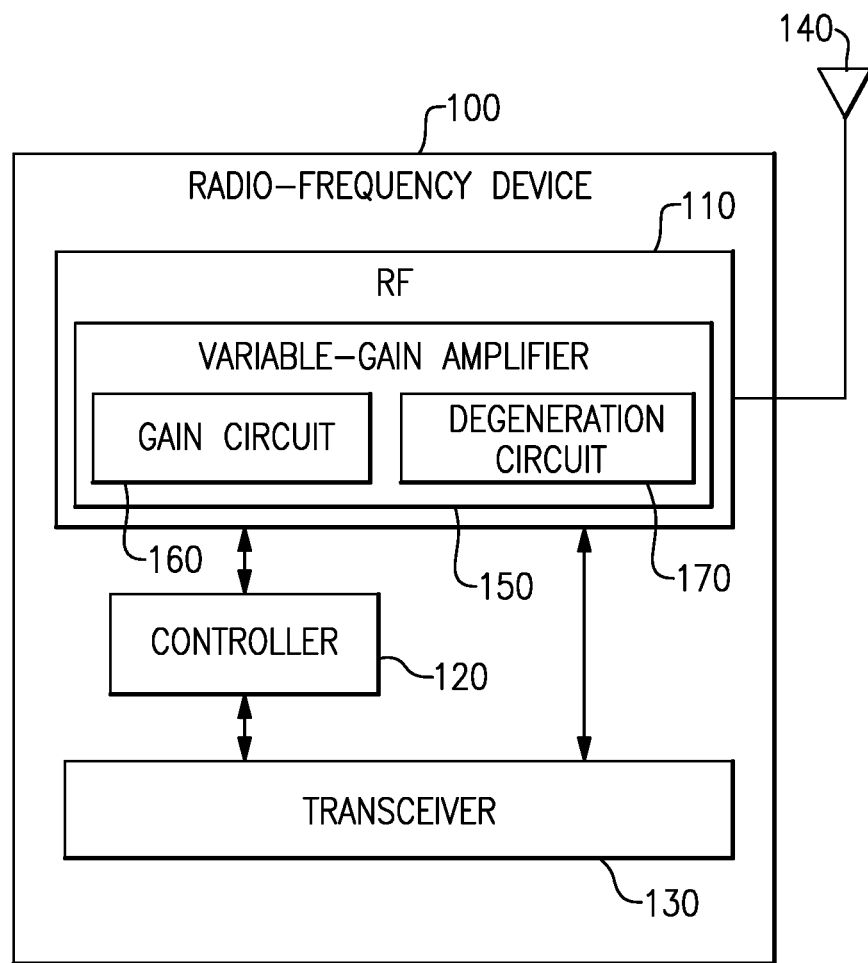
FIG. 1 illustrates an example radio-frequency device having various features relevant to certain aspects of the present disclosure.

FIG. 1 illustrates an example radio-frequency device 100 having various features relevant to certain aspects of the present disclosure. The radio-frequency device 100 includes an RF module 110, a transceiver 130, a controller 120, and an antenna 140. The transceiver 130 can be configured to convert between analog signals and digital signals. The transceiver 130 can include a digital-to-analog converter, an analog-to-digital converter, a local oscillator for modulating or the modulating a baseband signal to or from a carrier frequency, a baseband processor that converts between digital samples and data bits (e.g., voice or other types of data), or other components. The RF module 110 can perform processing on an analog signal received from on an antenna 140 or received from the transceiver 134. The RF module 110 can include filters, power amplifiers, low noise amplifiers, band select switches, attenuators, matching circuits, and/or other components. In some embodiments, the RF module 110 can be referred to as a front-end module (FEM), which can be physically close to the antenna 140 (e.g., to reduce attenuation to cable loss). The controller 120 can communicate with the transceiver 130 and/or the RF module 110 to facilitate various functionality discussed herein.

The RF module 110 can include a variable-gain amplifier 150 configured to provide a plurality of gain modes to amplify signals received and/or sent via the antenna 140. The variable-gain amplifier 150 can include a gain circuit 160 configured to amplify a signal received at the variable-gain amplifier 150 and a degeneration circuit 170 that is configured to change an impedance (e.g., degeneration inductance) based on a gain mode of the variable-gain amplifier 150. The controller 120 can control a gain mode of the variable-gain amplifier 150 and/or an impedance selected for the degeneration circuit 170. For example, the variable-gain amplifier 150 can be configured to provide a first amplification gain for a first gain mode, a second amplification gain for a second mode, and so on. The controller 120 can provide a control signal to the variable-gain amplifier 150 to control the gain provided by the variable-gain amplifier 150.

In some embodiments, the degeneration circuit 170 can be controlled to change an inductance to provide a target gain amount for the variable-gain amplifier 150. Further, the degeneration circuit 170 can be controlled to increase performance of the variable-gain amplifier 150 (in comparison to other amplifiers) by increasing linearity, reducing noise introduced during application, helping with stability, and/or lowering input reflections, for example. As such, the variable-gain amplifier 150 can achieve targeted or improved performance by using the degeneration circuit 170 that is configurable to provide tailored impedances for different gain modes. For example, the degeneration circuit 170 can allow the variable-gain amplifier 150 to be coupled to a desired or target impedance for particular gain modes and/or signal amplitudes.

The controller 120 can be configured to generate and/or send control signals to components of the radio-frequency device 100. In examples, the controller 120 can send a control signal to the variable-gain amplifier 150 to control a gain mode of the variable-gain amplifier 150. For example, the controller 120 can provide a control signal indicative of a desired or targeted gain to the variable-gain amplifier 150. Each gain mode can be associated with a different amount of amplification. Further, in examples, the controller 120 can send a control signal to the variable-gain amplifier 150 to configure an impedance of the variable-gain amplifier 150 (e.g., to set a configuration of the degeneration circuit 170). For example, the controller 120 can provide a control signal indicative of a desired or targeted inductance to the variable-gain amplifier 150.

In some embodiments, the controller 120 generates a control signal based on a quality of service (QoS) metric associated with a signal. A QoS metric can include a metric associated with a signal(s) received or sent via the antenna 140, such as a signal strength, a bit error rate, a data throughput, a transmission delay, a signal-to-to-noise ratio, or any other metric. In some embodiments, the controller 120 can be configured to receive a signal from a component of the radio-frequency device 100 and determine a control signal to provide to another component based on the received signal. For example, the controller 120 can generate a control signal based on a signal received from a communications controller, which can be based on QoS metric of a received signal. In some embodiments, the controller 120 provides control signals based on specifications provided by the mobile industry processer interface alliance (MIPI® Alliance).

In some embodiments, the variable-gain amplifier 150 can include a step-variable gain amplifier configured to amplify received signals with a gain of one of a plurality of configured amounts indicated by a control signal. Further, in some embodiments, the variable-gain amplifier 150 can include a continuously-variable gain amplifier configured to amplify received signals with a gain proportional to or dictated by a control signal. Moreover, in some embodiments, the variable-gain amplifier 150 can include a step-variable current amplifier configured to amplify received signals by drawing a current of one of plurality of configured amounts indicated by a control signal. Furthermore, in some embodiments, the variable-gain amplifier 150 can include a continuously-variable current amplifier configured to amplify received signals by drawing a current proportional to a control signal.

In some embodiments, the antenna 140 includes a primary antenna and a diversity antenna. The primary antenna and the diversity antenna can be physically spaced apart such that a signal at the primary antenna and the diversity antenna are received with different characteristics. For example, the primary antenna and the diversity antenna can receive the signal with different attenuation, noise, frequency response, and/or phase shift. The transceiver 130 can use both of the signals with different characteristics to determine data bits corresponding to the signal. In some implementations, the transceiver 130 selects between the primary antenna and the diversity antenna based on the characteristics, such as selecting the antenna with the highest signal-to-noise ratio. In some embodiments, the transceiver 130 combines signals from the primary antenna and the diversity antenna to increase the signal-to-noise ratio of the combined signal. In some embodiments, the transceiver 130 processes the signals to perform multiple-input/multiple-output (MIMO) communication. As noted above, in some embodiments, the diversity antenna is physically spaced apart from the primary antenna. Here, the diversity antenna can be coupled to the transceiver 130 by a transmission line, such as a cable, a printed circuit board (PCB) trace, or another component.

In examples, the transmission line is lossy and/or attenuates the signal received at the diversity antenna before it reaches the transceiver 130.

In some embodiments, the antenna 140 is configured to receive signals within multiple cellular frequency bands and/or wireless local area network (WLAN) frequency bands. In such embodiments, the radio-frequency device 100 can include a multiplexer, switching network, and/or filter assembly coupled to a diversity antenna that is configured to separate the diversity signal into different frequency ranges. For example, the multiplexer can be configured to include a low pass filter that passes a frequency range that includes low band cellular frequencies, a bandpass filter that passes a frequency range that includes low band WLAN signals and mid-band and high-band cellular signals, and a high pass filter that passes a frequency range that includes high-band WLAN signals. This example is merely for illustrative purpose. As another example, the multiplexer can have a variety of different configurations such as a diplexer that provides the functionality of a high pass filter and a low pass filter.

The variable-gain amplifier 150 can be implemented within a low noise amplifier (LNA), a power amplifier (PA), or any other component. For example, the RF module 110 can include an LNA configured to receive a signal from the antenna 140 and amplify the signal using the variable-gain amplifier 150. In some embodiments, multiple variable-gain amplifiers are implemented on the radio-frequency device 100. For example, a first module can be implemented with a first variable-gain amplifier to amplify a signal from a diversity antenna and a second module can be implemented with a second variable-gain amplifier to amplify a signal from a primary antenna. In examples, a module associated with a diversity antenna can be referred to as a diversity receiver front-end module and/or can be located physically close to the diversity antenna.

Figure 2:
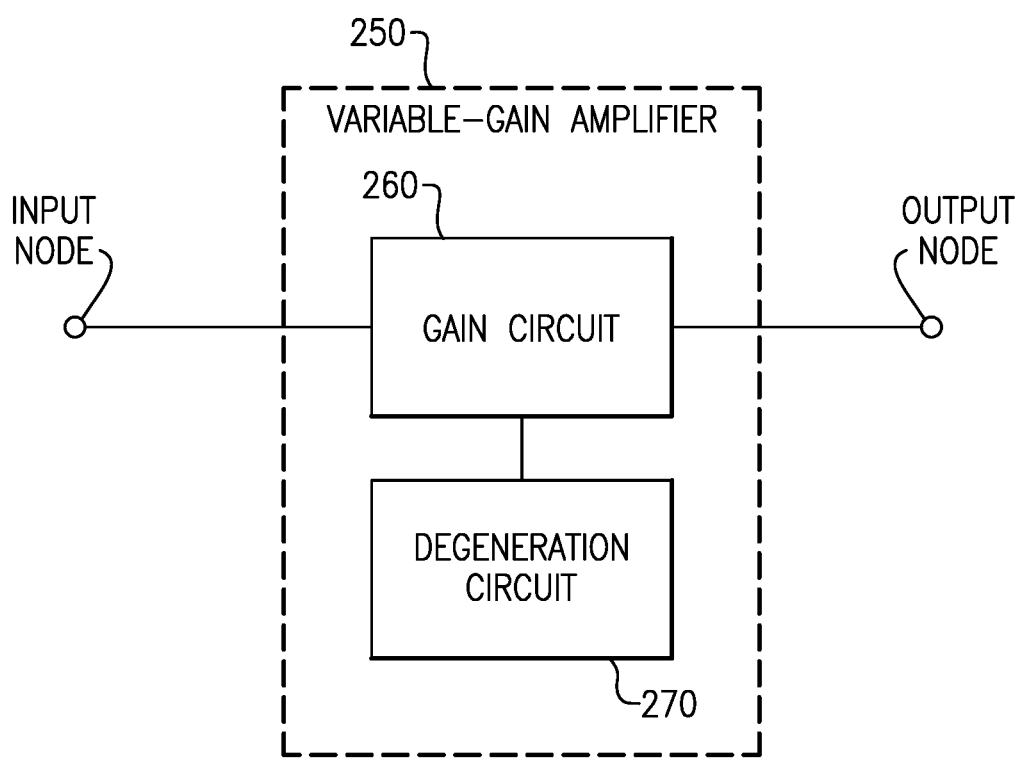
FIG. 2 illustrates an example variable-gain amplifier that includes a gain circuit coupled to a degeneration circuit in accordance with one or more embodiments.

FIG. 2 illustrates an example variable-gain amplifier 250 that includes a gain circuit 260 coupled to a degeneration circuit 270. The gain circuit 160 can be configured to receive an input signal and to generate an amplified output signal. For example, the variable-gain amplifier 250 can receive an input signal via the input node, amplify the signal using the gain circuit 260, and provide an amplified output signal via the output node. The degeneration circuit 270 can be configured to provide a plurality of different impedances for the gain circuit 260. A selected impedance can be based on a gain mode of the variable-gain amplifier 250. For example, the degeneration circuit 270 can be configured to provide a first impedance for a first gain mode, a second impedance for a second gain mode, and so on.

Figure 3:
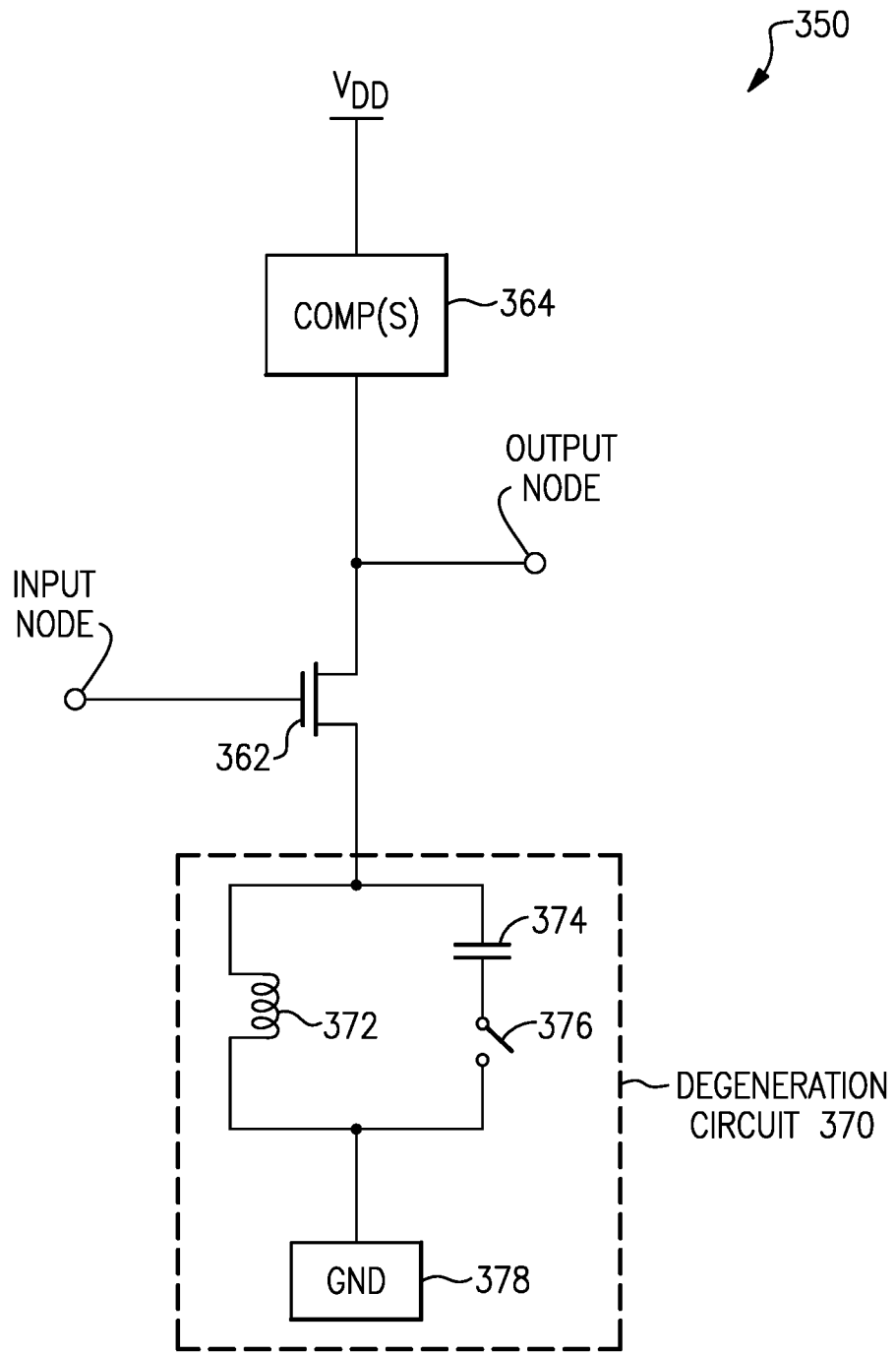
FIG. 3 illustrates an example variable-gain amplifier that includes a gain circuit and a degeneration circuit in accordance with one or more embodiments.

FIG. 3 illustrates an example variable-gain amplifier 350 that includes a gain circuit and a degeneration circuit 370. Here, the variable-gain amplifier 350 can receive an input signal at an input node and provide an output signal at an output node. The variable-gain amplifier 350 includes a transistor 362 to amplify the input signal based on a gain mode that is selected. The transistor 362 includes a gate or base coupled to the input node, a drain or collector coupled to the output node, and a source or emitter coupled to the degeneration circuit 370. As such, the example of FIG. 3 illustrates a source or emitter degeneration circuit to degenerate a source connection (e.g., a circuit coupled between a source/emitter of the transistor 362 and a ground). However, in other examples, the degeneration circuit 370 can be coupled to other portions of the transistor 362, such as the gate, the drain/collector, the body, etc. In some embodiments, the variable-gain amplifier 350 can also include one or more components 364 coupled to the drain or collector of the transistor 362, such as one or more inductors, one or more capacitors, one or more transistors, or other components. Although illustrated in FIG. 3, in some embodiments the one or more components 364 can be eliminated. The transistor 362, the one or more components 364, and/or a supply voltage (labeled "VDD") can be referred to as the gain circuit. However, in some embodiments, one or more components of the degeneration circuit 370 can additionally, or alternatively, be part of the gain circuit.

The transistor 362 can be implemented as a single device or multiple devices, such as multiple transistors in a cascoded configuration. The transistor 362 can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), and so on. Further, the transistor 362 can include a Bipolar junction transistor (BJT) (e.g., an NPN transistor, a PNP transistor, etc.), such as a heterojunction bipolar transistors (HBT), etc. For ease of illustration, the transistor 362 is shown in many examples as an FET, such as an n-type (or p-type) MOSFET. However, the transistor 362 can be implemented as any type of transistor.

The degeneration circuit 370 can include an inductor 372 and a switching-capacitive arm coupled in parallel to the inductor 372. The switching-capacitive arm can include a capacitor 374 and a switch 376 coupled in series, as illustrated. Although a single capacitor and a single switch are illustrated in FIG. 3, any number of capacitors and/or switches can be implemented in parallel or series with each other and/or the inductor 372. In some embodiments, multiple switching-capacitive arms are implemented in parallel, such as that illustrated in FIG. 6. The degeneration circuit 370 can also include a ground pad 378 configured to connect to a ground or other voltage potential.

The transistor 376 can be implemented as a wide variety of switches, such as voltage-controlled switches, current-controlled switches, etc. For example, the switch 376 can be implemented as a transistor, a mechanical switch, etc. A transistor can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), and so on. Further, a transistor can include a Bipolar junction transistor (BJT) (e.g., an NPN transistor, a PNP transistor, etc.), such as a heterojunction bipolar transistors (HBT), etc.

The variable-gain amplifier 350 can be configured to operate in a plurality of gain modes. Each gain mode can be associated with a different amount of gain. For example, in a first gain mode, an input signal can be amplified by a first amount of amplification, in a second gain mode, an input signal can be amplified by a second amount of amplification that is different than the first amount of amplification, and so on. To set a gain mode, a controller (not illustrated) can provide a control signal to the variable-gain amplifier 350 or another component to set the variable-gain amplifier 350 to operate in the gain mode. In some embodiments, the supply voltage (labeled "VDD") can be configured to set a gain mode of the variable-gain amplifier 350. For example, the supply voltage can be controlled to provide a first voltage for a first gain mode, provide a second voltage for a second gain mode, and so on.

The degeneration circuit 370 can be configured based on a gain mode. In particular, a configuration of the switching-capacitive arm of the degeneration circuit 370 can be adjusted based on a gain mode in which the variable-gain amplifier 350 is operating. For example, in a first gain mode, the switch 376 can be placed in a closed state to allow a current to pass through the capacitor 374 (e.g., a closed circuit configuration), and in a second gain mode, the switch 376 can be placed in an open state to prevent a current from passing through the capacitor 374 (e.g., an open circuit configuration). By changing the configuration of the switching-capacitive arm, the variable-gain amplifier 350 can change a degeneration inductance for the variable-gain amplifier 350 to provide a particular gain amount or performance characteristics. Further, by implementing the capacitor 374, instead of inductors in a variety of configurations, the variable-gain amplifier 350 can efficiently use area on a device. In some embodiments, an inductor can occupy an area that is ten times (or more) larger than an area occupied by capacitor. As such, the variable-gain amplifier 350 can substantially reduce an area needed to implement an amplifier that is configured to provide multiple gain modes.

Figure 4A:
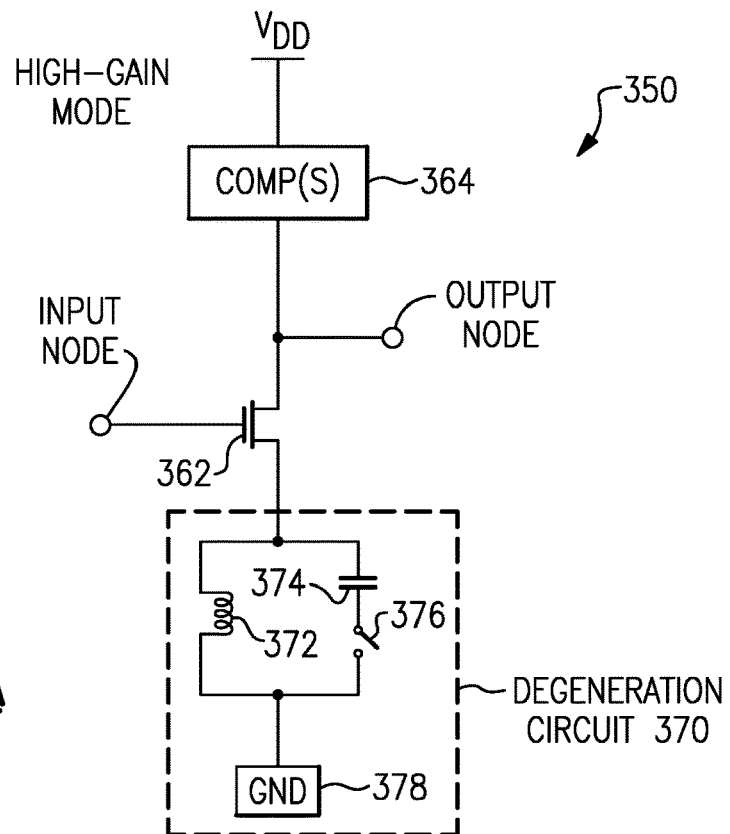
FIGS. 4A-4B illustrate example configurations of the variable-gain amplifier of FIG. 3 for multiple gain modes in accordance with one or more embodiments.
Figure 4B:
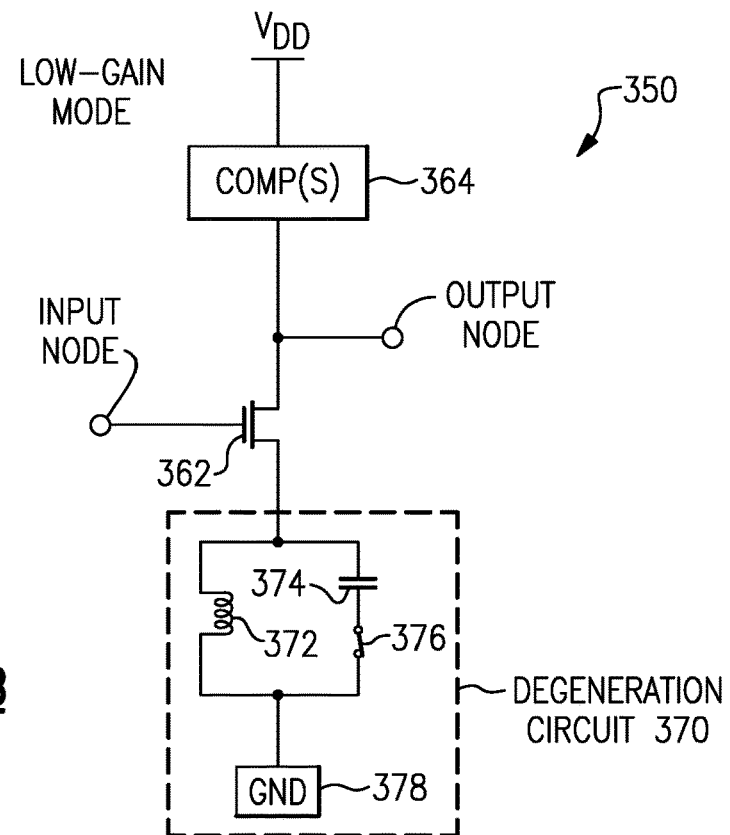

FIGS. 4A-4B illustrate example configurations of the variable-gain amplifier 350 of FIG. 3 for multiple gain modes. In particular, FIG. 4A illustrates the variable-gain amplifier 350 configured to operate in a high-gain mode, while FIG. 4B illustrates the variable-gain amplifier 350 configured to operate in a low-gain mode. A high-gain mode is associated with more amplification than a low-gain mode. In one example, a high-gain mode can be associated with more than a first threshold of amplification, while a low-gain mode can be associated with less than the first threshold of amplification or less than a second threshold of amplification that is less than the first threshold of amplification. For instance, a high-gain mode can be associated with more than 20 dB of amplification, while a low-gain mode can be associated with less than 20 dB of amplification. Although configurations are illustrated for two gain modes in FIGS. 4A-4B, any number of gain modes can be implemented with any number of configurations and/or levels of amplification.

In a high-gain mode, as illustrated in FIG. 4A, the switching-capacitive arm of the degeneration circuit 370 is set to an open circuit configuration. In particular, the switch 376 is implemented with an open state so that the switching-capacitive arm is viewed as an open circuit (e.g., current passes through just the arm with the inductor 372). Here, the inductance of the degeneration circuit 370 is lower, since the switching-capacitive arm with the capacitor 374 is not a conducting path from the transistor 362 to the ground pad 378. In contrast, in a low-gain mode, as illustrated in FIG. 4B, the switching-capacitive arm of the degeneration circuit 370 is set to a closed-circuit configuration. In particular, the switch 376 is implemented with a closed state so that the switching-capacitive arm is viewed as a closed circuit (e.g., current is able to pass through the arm with the inductor 372 and the switching-capacitive arm). Here, the inductance of the degeneration circuit 370 is higher, since the switching-capacitive arm with the capacitor 374 is now a conducting path from the transistor 362 to the ground pad 378.

An amplifier can provide a plurality of gain modes for a variety of purposes. For example, multiple gain modes can be used to convert received signals of different signal strengths to a relatively consistent signal strength. To illustrate, multiple gain modes can be utilized to amplify received signals as a first radio-frequency device changes location relative to a second radio-frequency device and a signal strength of the received signals communicated between the radio-frequency devices changes.

Figure 5:
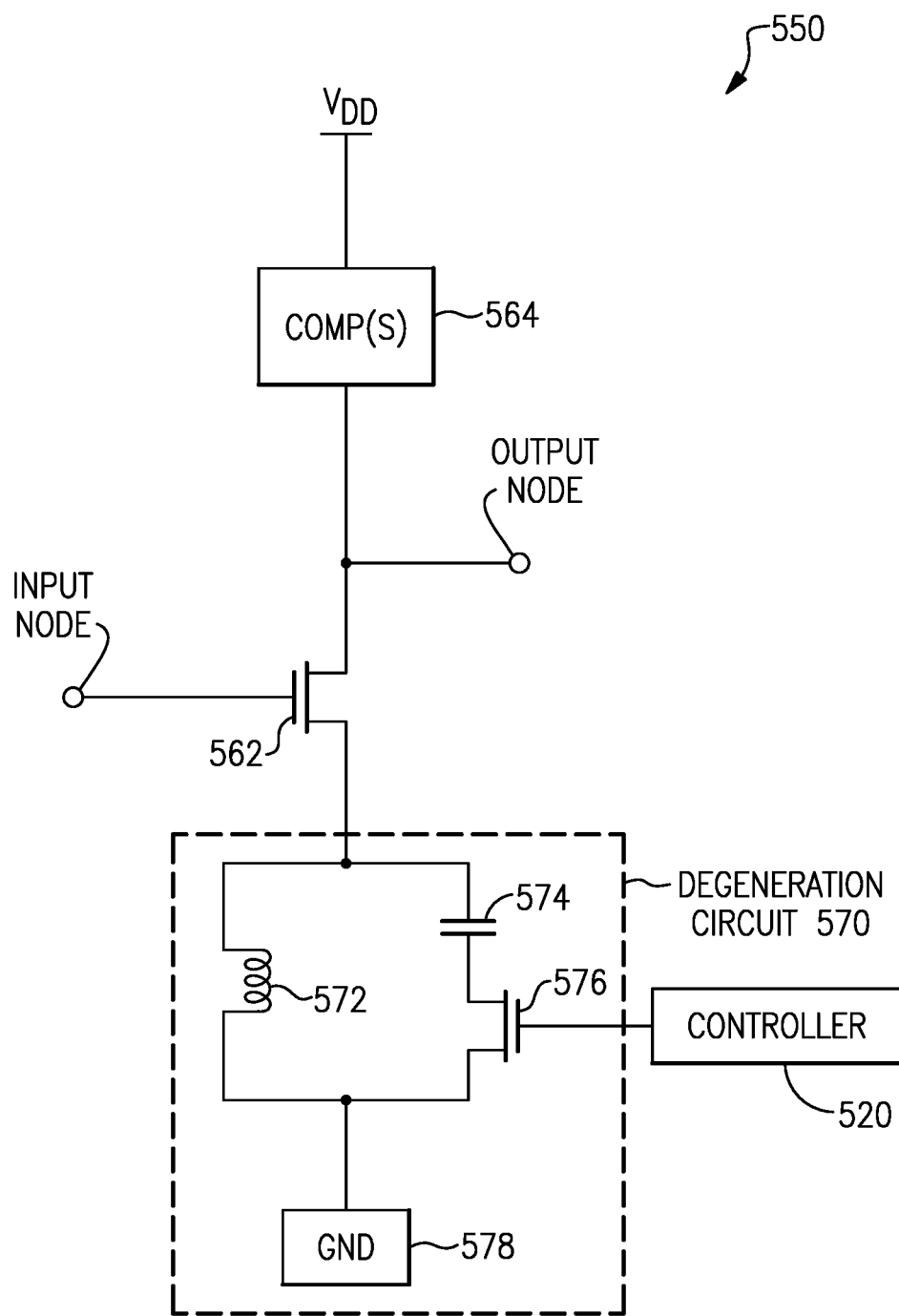
FIG. 5 illustrates an example variable-gain amplifier with a degeneration circuit that includes a transistor implemented as a switch in accordance with one or more embodiments.

FIG. 5 illustrates an example variable-gain amplifier 550 with a degeneration circuit 570 that includes a transistor 576 implemented as a switch. Here, the variable-gain amplifier 550 can receive an input signal at an input node and provide an output signal at an output node. The variable-gain amplifier 550 includes a transistor 562 to amplify the input signal. The transistor 562 includes a gate or base coupled to the input node, a drain or collector coupled to the output node, and a source or emitter coupled to the degeneration circuit 570. In this example, the variable-gain amplifier 550 also includes one or more components 564 coupled to the drain or collector of the transistor 562, such as one or more inductors, one or more capacitors, one or more transistors, or other components.

The degeneration circuit 570 can include an inductor 572 and a switching-capacitive arm coupled in parallel to the inductor 572. The switching-capacitive arm can include a capacitor 574 and the transistor 576 coupled in series, as illustrated. Although a single capacitor and a single transistor are illustrated in FIG. 5, any number of capacitors and/or switches can be implemented in parallel or series with each other and/or the inductor 572. The degeneration circuit 570 can also include a ground pad 578 configured to connect to a ground or other voltage potential. In this example the transistor 576 is implemented to enable or disable the switching-capacitive arm (e.g., the capacitor 574). Here, a controller 520 is coupled to a gate of the transistor 576 to control the transistor 576 by placing the transistor 576 in an open state (e.g., off state) or closed state (e.g., on state). In particular, the controller 520 can provide a control signal, such as a voltage or current signal, to bias the transistor 576. In some embodiments, the controller 520 also provides a control signal to a supply voltage component to set a supply voltage. While in other embodiments, a separate controller is implemented to communicate with the supply voltage component. Although the controller 520 is shown outside the degeneration circuit 570, in some embodiments the controller 520 is part of the degeneration circuit 570.

The inductor 572 and the capacitor 574 can have a variety of values. In some embodiments, the inductor 572 can have an inductance of 100 pH to 5 nH and the capacitor can have a capacitance of 50 fF to 15 pF. Although other inductance or capacitance values can be implemented.

Figure 6:
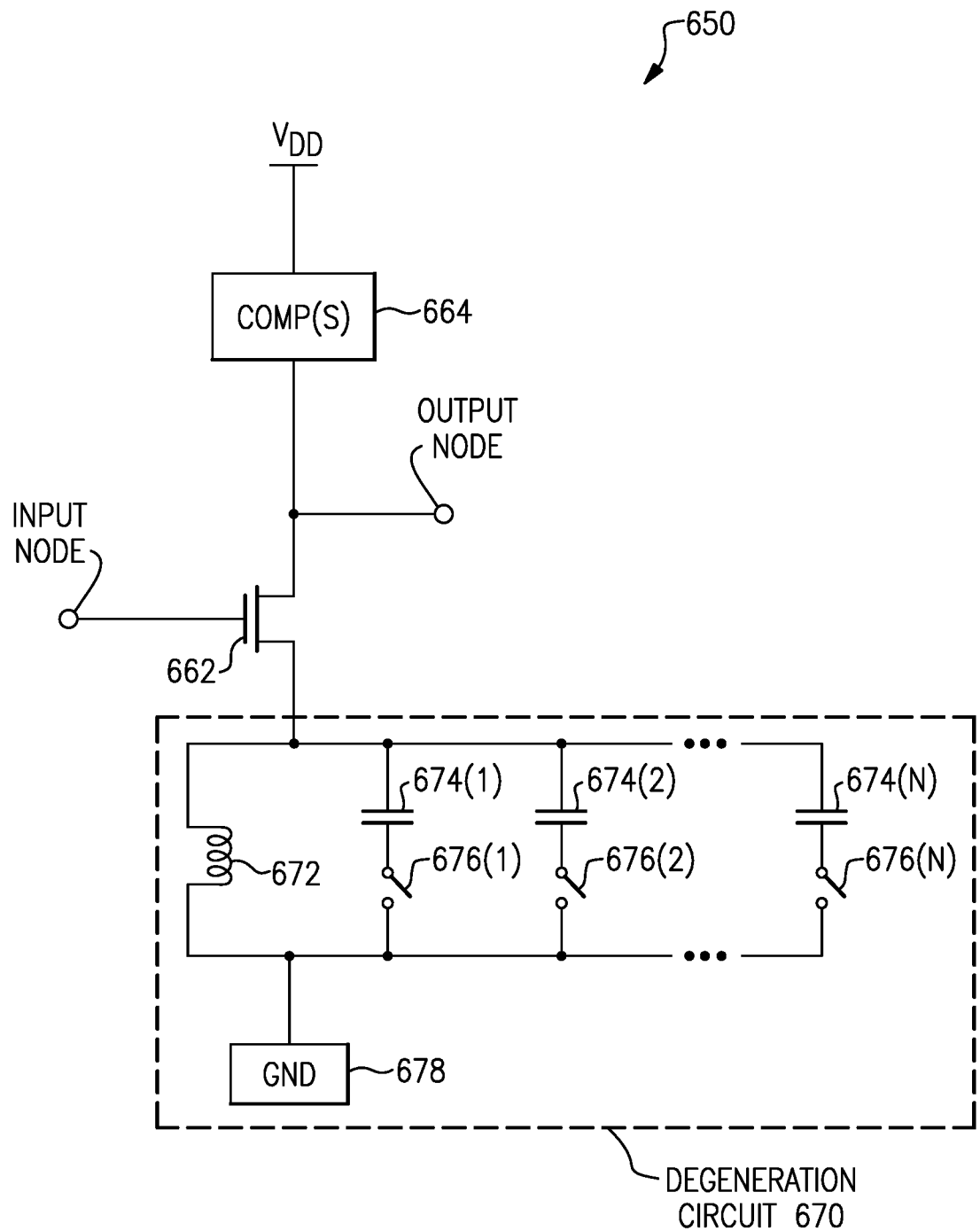
FIG. 6 illustrates an example variable-gain amplifier with a degeneration circuit that includes multiple switching-capacitive arms in accordance with one or more embodiments.

FIG. 6 illustrates an example variable-gain amplifier 650 with a degeneration circuit 670 that includes multiple switching-capacitive arms. Here, the variable-gain amplifier 650 can receive an input signal at an input node and provide an output signal at an output node. The variable-gain amplifier 650 includes a transistor 662 to amplify the input signal. The transistor 662 includes a gate or base coupled to the input node, a drain or collector coupled to the output node, and a source or emitter coupled to the degeneration circuit 670. In this example, the variable-gain amplifier 650 also includes one or more components 664 coupled to the drain or collector of the transistor 662, such as one or more inductors, one or more capacitors, one or more transistors, or other components.

The degeneration circuit 670 can include an inductor 672 and multiple switching-capacitive arms coupled in parallel to the inductor 672. The switching-capacitive arms include capacitors 674(1)-674(N) and switches 676(1)-676(N). In particular, each switching-capacitive arm includes a capacitor 674 and a transistor 676 coupled in series. The degeneration circuit 670 can also include a ground pad 578 configured to connect to a ground or other voltage potential. In some embodiments, the multiple switching-capacitive arms can be implemented to more finely tune the variable-gain amplifier 650 and/or to tune the variable gain amplifier 650 to more gain modes, in comparison to other amplifiers.

For example, the variable-gain amplifier 650 can be implemented with five to eight gain modes, with the degeneration circuit 670 including four to seven switching-capacitive arms for the gain modes. In other examples, any number of gain modes can be implemented with any number of switching-capacitive arms.

Figure 7:
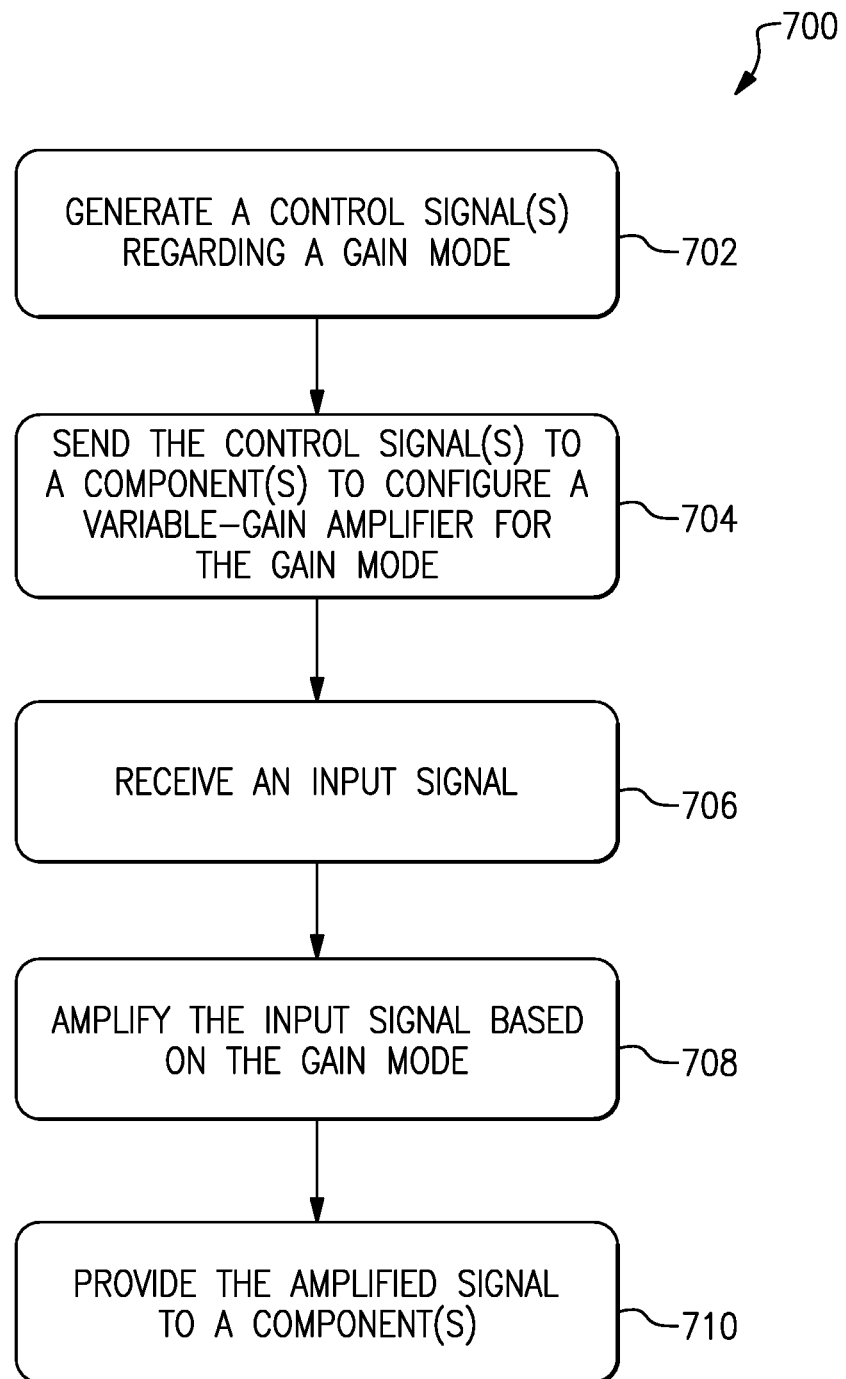
FIG. 7 illustrates an example flow diagram of a process of controlling a variable-gain amplifier in accordance with one or more embodiments.

FIG. 7 illustrates an example flow diagram of a process 700 of controlling a variable-gain amplifier. The process 700 can be implemented by any of the components of the variable-gain amplifiers discussed herein.

At 702, a control signal(s) regarding a gain mode can be generated. For example, a controller can generate a control signal indicating a gain mode and/or an impedance (e.g., degeneration inductance) to implement for the gain mode. The controller can generate the control signal based on a variety of factors, such as a QoS metric, a signal from another component, etc.

At 704, the control signal(s) can be sent to one or more components to configure a variable-gain amplifier for the gain mode. For example, a controller can send a control signal to one or more components of a variable-gain amplifier, such as a degeneration circuit and/or a supply voltage component, to configure the one or more components of the variable-gain amplifier to implement a gain mode that is selected for operation. The control signal can configure a component of the variable-gain amplifier by setting a supply voltage, biasing a transistor of a degeneration circuit to an on or off state, etc. As such, a degeneration circuit of a variable-gain amplifier can be configured to provide a tailored amount of degeneration inductance for a gain mode.

At 706, an input signal can be received. For example, a variable-gain amplifier can receive a signal from an antenna. Alternatively, or additionally, a variable-gain amplifier can receive a signal from a transceiver or another component of a radio-frequency device of the variable-gain amplifier.

At 708, the input signal can be amplified based on the gain mode. For example, a variable-gain amplifier that is configured for the gain mode, such as with a tailored amount of degeneration inductance, can amplify the input signal with an amplification amount that is associated with the gain mode.

At 710, the amplified signal can be provided to one or more components. For example, a variable-gain amplifier can provide an amplified signal as an output signal to one or more components of a radio-frequency device associated with the variable-gain amplifier. For instance, the amplified signal can be provided to a transceiver of the radio-frequency device, an antenna of the radio-frequency device, and so on.

Figure 8:
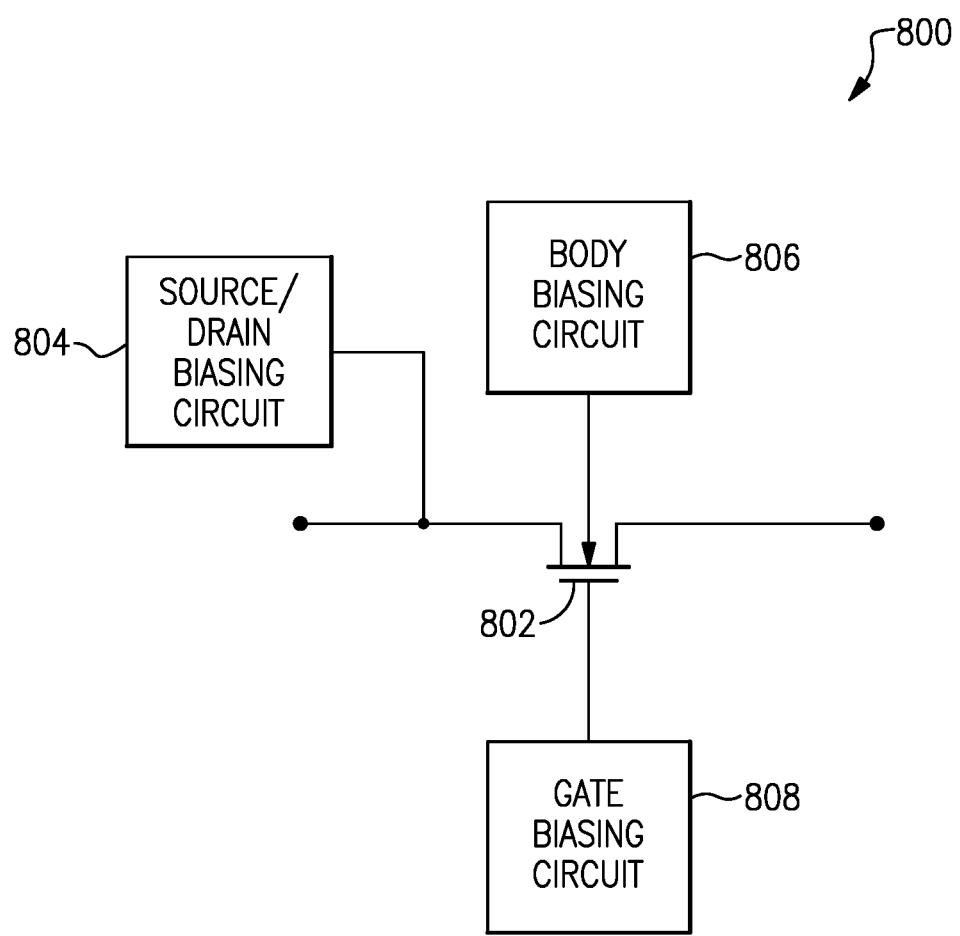
FIG. 8 illustrates example biasing circuitry for a transistor in accordance with one or more embodiments.

FIG. 8 illustrates example biasing circuitry 800 for a transistor 802. The transistor 802 can be representative of any of the transistors discussed herein. That is, any of the transistors discussed herein can be biased in a similar manner as that of the example biasing circuitry 800 of the transistor 802. As such, although not illustrated in some cases, any of the transistors discussed herein can be connected to any number of biasing circuits to control the transistors.

In the example of FIG. 8, a source and/or drain of the transistor 802 is connected to a source/drain biasing circuit 804 that applies a biasing voltage to the source and/or drain of the transistor 802, a body of the transistor 802 is connected to a body biasing circuit 806 that applies a biasing voltage to the body of the transistor 802, and a gate of the transistor 802 is connected to a gate biasing circuit 808 that applies a biasing voltage to the gate of the transistor 802. The source/drain biasing circuit 804, the body biasing circuit 806, and/or the gate biasing circuit 808 can apply voltages that are more or less than a value to control the transistor 802 (e.g., place the transistor in an on or off state). In some embodiments, the source/drain biasing circuit 804, the body biasing circuit 806, and/or the gate biasing circuit 808 are implemented as a controller. Further, in some embodiments, the transistor 802 is implemented as a transistor stack that includes multiple transistors connected in series.

Figure 9:
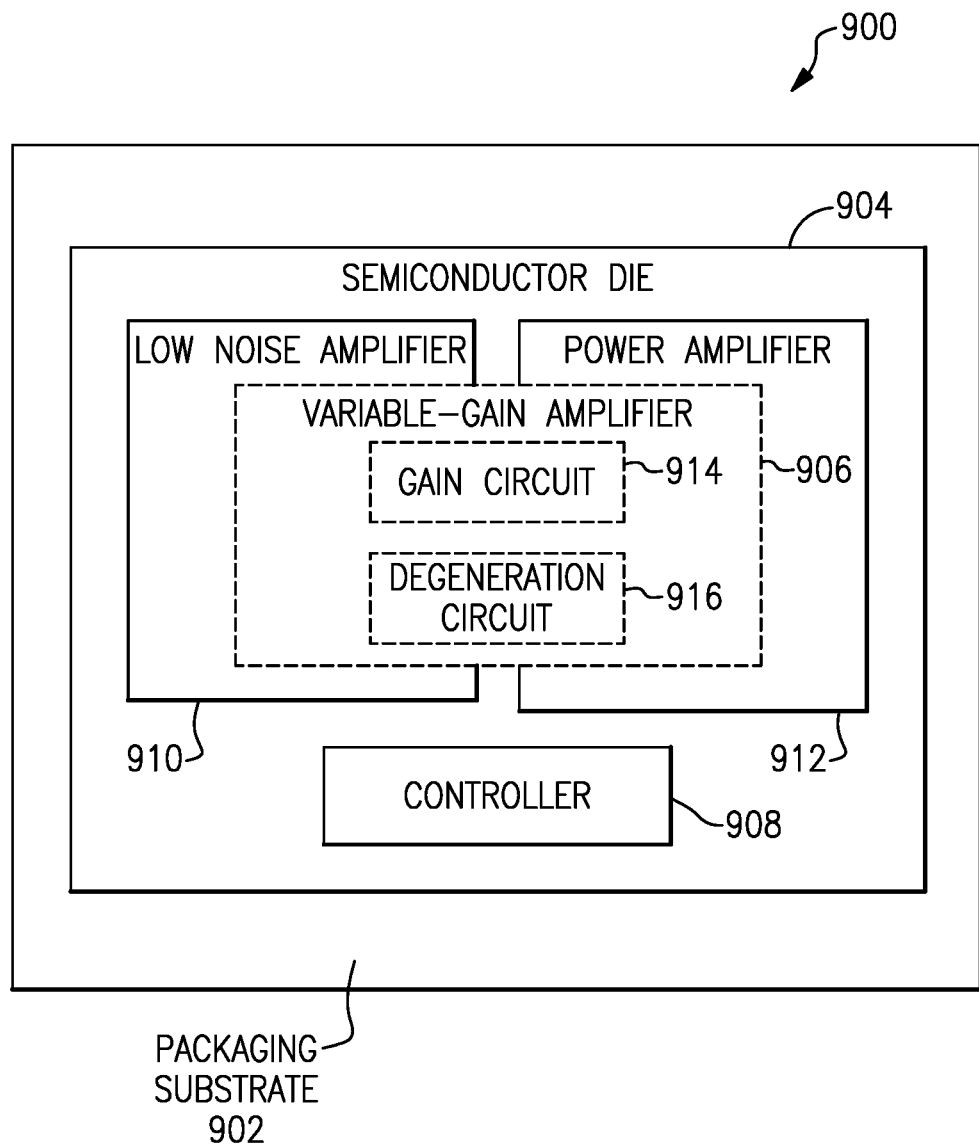
FIG. 9 illustrates an example radio-frequency module in accordance with one or more embodiments.

FIG. 9 illustrates an example radio-frequency module 900. The radio-frequency module 900 includes a packaging substrate 902, a semiconductor die 904 mounted on the packaging substrate 902, a variable-gain amplifier 906 implemented on the semiconductor die 904, and a controller 908 implemented on the semiconductor die 904. The variable-gain amplifier 906 can include any of the variable-gain amplifiers discussed herein. Similarly, the controller 908 can include any of the controllers discussed herein. In some embodiments, the variable-gain amplifier 906 is implemented within a low noise amplifier (LNA) 910 provided on the semiconductor die 904. Alternatively, or additionally, the variable-gain amplifier 906 is implemented within a power amplifier (PA) 912. The variable-gain amplifier 906 can also be implemented within other amplifiers. Further, in some embodiments, multiple variable-gain amplifiers are implemented within different components (e.g., a first variable-gain amplifier is implemented within the LNA 910 and a second variable-gain amplifier is implemented within the PA 912). Although illustrated as separate components, in some cases the controller 908 is implemented as part of the variable-gain amplifier 906. In some embodiments, the radio-frequency module 900 can be a front-end module (FEM).

As shown, the variable-gain amplifier 906 can include a gain circuit 914 coupled to a degeneration circuit 916. Although the gain circuit 914 and the degeneration circuit 916 are illustrated as being implemented on the same semiconductor die and packaging substrate, in some embodiments the gain circuit 914 and the degeneration circuit 916 are implemented on different semiconductor dies and/or packaging substrates. For example, the gain circuit 914 can be implemented on a first semiconductor die and the degeneration circuit 916 can be implemented on a second semiconductor die. In some embodiments, a capacitor and/or an inductor of the degeneration circuit 916 can be surface mounted. Further, in some embodiments, the controller 908 and the variable-gain amplifier 906 can be implemented on different semiconductor dies and/or packaging substrates.

Figure 10:
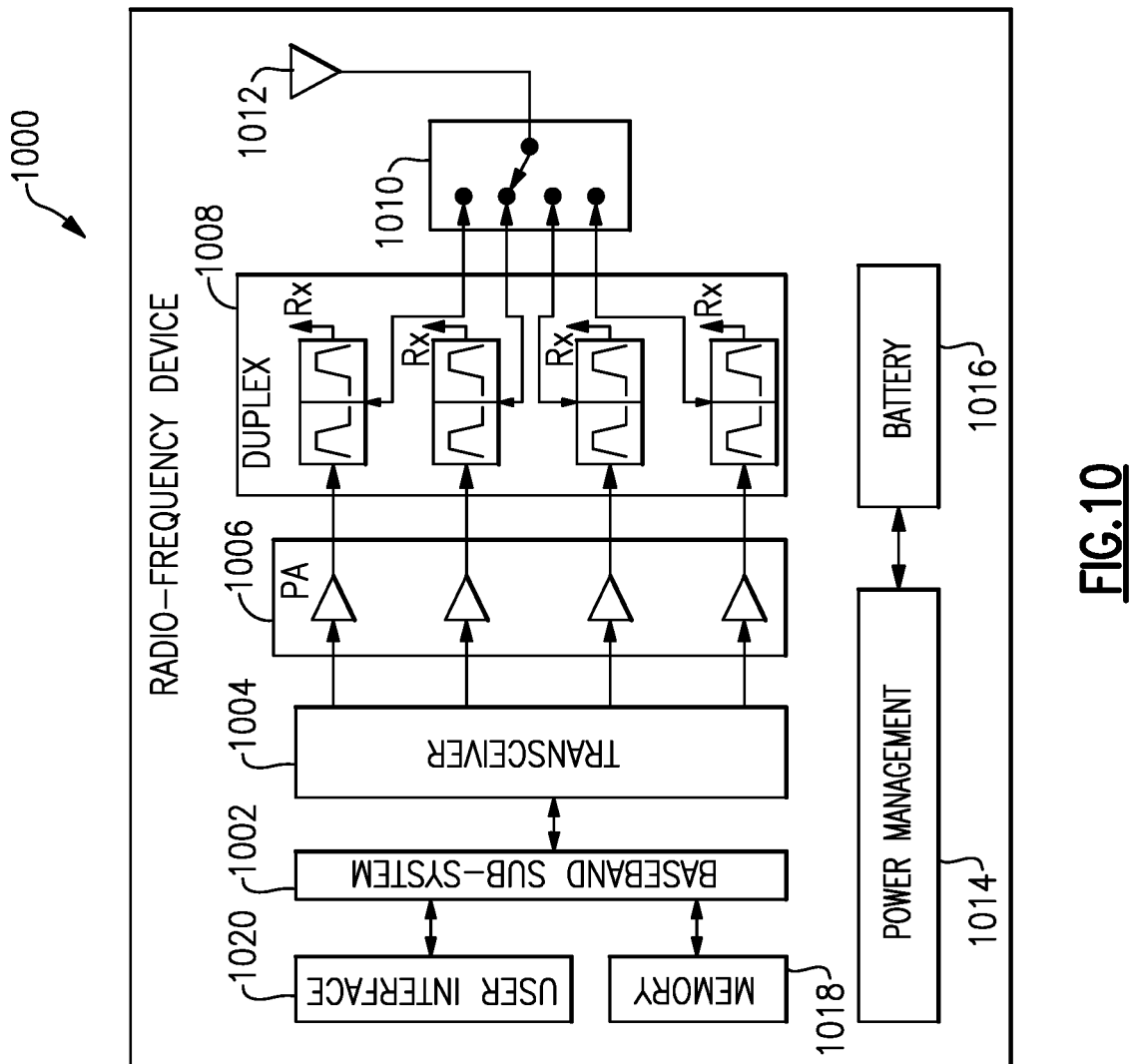
FIG. 10 illustrates an example radio-frequency device in accordance with one or more embodiments.

FIG. 10 illustrates an example radio-frequency device 1000. As shown, the radio-frequency device 1000 can include a baseband sub-system 1002, a transceiver 1004, a power amplifier (PA) module 1006, a duplexer 1008, a switch 1010, one or more antennas 1012, a power management system 1014, a battery 1016, a memory 1018, and a user interface 1020. The baseband sub-system 1002, the transceiver 1004, the PA module 1006, the duplexer 1008, the switch 1010, one or more antennas 1012, the power management system 1014, the battery 1016, the memory 1018, and/or the user interface 1020 can be in communication with each other.

The baseband sub-system 1002 can be connected to the user interface 1020 to facilitate various input and/or output of voice and/or data provided to and/or received from a user. The baseband sub-system 1002 can also be connected to the memory 1018 that is configured to store data and/or instructions to facilitate operation of the radio-frequency device 1000 and/or to provide storage of information for a user.

The transceiver 1004 can generate radio-frequency (RF) signals for transmission and/or process incoming RF signals received from the one or more antennas 1012. The transceiver 1004 can interact with the baseband sub-system 1002 that is configured to provide conversion between data and/or voice signals suitable for a user and/or RF signals suitable for the transceiver 1004. The transceiver 1004 can also be connected to the power management system 1014.

The PA module 1006 can include a plurality of PAs that can provide an amplified RF signal to the switch 1010 (e.g., via the duplexer 1008). The PA module 1006 can also receive an unamplified RF signal from the transceiver 1004. In examples, the duplexer 1008 can allow transmit and/or receive operations to be performed simultaneously using a common antenna. In FIG. 10, received signals are shown to be routed to "Rx" paths that can include, for example, a low-noise amplifier (LNA). In some embodiments, any of the variable-gain amplifiers discussed herein are implemented within an LNA, the PA module 1006, or another component.

The switch 1010 can route an RF signal to and/or from the one or more antennas 1012. The switch 1010 can include any number of poles and/or throws. In examples, the switch 1010 is implemented on a module. The module can include a packaging substrate configured to receive a plurality of components. Although one switch 1010 is illustrated in the example of FIG. 10, any number of switches can be implemented on the radio-frequency device 1000.

The one or more antennas 1012 can include antennas for transmitting and/or receiving signals associated with a wide variety of frequencies and communications standards. In examples, the one or more antennas 1012 support Multiple-Input Multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator. In examples, the one or more antennas 1012 can include a diversity antenna.

The power management system 1014 can be configured to manage power for operation of the radio-frequency device 1000. The power management system 1014 can provide power to any number of components of the radio-frequency device 1000. The power management system 1014 can receive a battery voltage from the battery 1016. The battery 1016 can be any suitable battery for use in the radio-frequency device 1000, including, for example, a lithium-ion battery.

The radio-frequency device 1000 can communicate using a wide variety of communications technologies, including, but not limited to, 2G, 3G, 4G (including Long Term Evolution (LTE), LTE-Advanced, and LTE-Advanced Pro), 5G NR, Wireless Local Area Network (WLAN) (for instance, Wi-Fi), Wireless Personal Area Network (WPAN) (for instance, Bluetooth and ZigBee), Wireless Metropolitan Area Network (WMAN) (for instance, WiMax), and/or satellite-based radio navigation systems (for instance, Global Positioning System (GPS) technologies).

The radio-frequency device 1000 can operate with beamforming in certain implementations. For example, the radio-frequency device 1000 can include phase shifters having variable phase controlled by the transceiver 1004. Additionally, the phase shifters are controlled to provide beam formation and directivity for transmission and/or reception of signals using the one or more antennas 1012. For example, in the context of signal transmission, the phases of the transmit signals provided to the one or more antennas 1012 are controlled such that radiated signals from the one or more antennas 1012 combine using constructive and destructive interference to generate an aggregate transmit signal exhibiting beam-like qualities with more signal strength propagating in a given direction. In the context of signal reception, the phases are controlled such that more signal energy is received when the signal is arriving to the one or more antennas 1012 from a particular direction. In some embodiments, the one or more antennas 1012 include one or more arrays of antenna elements to enhance beamforming.

In examples, the radio-frequency device 1000 supports carrier aggregation, thereby providing flexibility to increase peak data rates. Carrier aggregation can be used for both Frequency Division Duplexing (FDD) and Time Division Duplexing (TDD) and can be used to aggregate a plurality of carriers or channels. Carrier aggregation includes contiguous aggregation, in which contiguous carriers within the same operating frequency band are aggregated. Carrier aggregation can also be non-contiguous and can include carriers separated in frequency within a common band or in different bands.

The radio-frequency device 1000 can include a wide variety of devices that are configured to communicate wirelessly. For example, the radio-frequency device 1000 can include a cellular phone, a smart-phone, a hand-held wireless device with or without phone functionality, a wireless tablet, a smart appliance, a smart vehicle, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wearable device (e.g., a watch), a clock, etc.

The detailed description is set forth with reference to the accompanying figures. In the figures, the left-most digit(s) of a reference number identifies the figure in which the reference number first appears. The use of the same reference numbers in different figures indicates similar or identical items.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Components discussed herein can be coupled or connected in a variety of manners, such as through a conductive material. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above description of embodiments of the disclosure is not intended to be exhaustive or to limit the disclosure to the precise form disclosed above. While specific embodiments, and examples, are described above for illustrative purposes, various equivalent modifications are possible within the scope of the disclosure, as those skilled in the relevant art will recognize. For example, while processes or blocks can be presented in a given order, alternative embodiments can perform routines having steps, or employ systems having blocks, in a different order, and some processes or blocks can be deleted, moved, added, subdivided, combined, and/or modified. Each of these processes or blocks can be implemented in a variety of different ways. Also, while processes or blocks are at times shown as being performed in series, these processes or blocks can instead be performed in parallel or can be performed at different times.

The features described herein can be applied to other systems, not necessarily the system described above. The elements and acts of the various embodiments described above can be combined to provide further embodiments.

While some embodiments have been described, these embodiments have been presented by way of example only, and are not intended to limit the scope of the disclosure. Indeed, the novel methods and systems described herein can be embodied in a variety of other forms; furthermore, various omissions, substitutions and changes in the form of the methods and systems described herein can be made without departing from the spirit of the disclosure. Claims and their equivalents are intended to cover such forms or modifications as would fall within the scope and spirit of the disclosure.

What is claimed is:

1. A variable-gain amplifier comprising:
   a gain circuit configured to amplify a signal; and
   a degeneration circuit coupled to the gain circuit, the degeneration circuit including an inductor and a switching-capacitive arm coupled in parallel to the inductor, the switching-capacitive arm including a capacitor and a switch, the switch being configurable to an off state for a first gain mode of the gain circuit and an on state for a second gain mode of the gain circuit, the first gain mode being associated with more gain than a threshold and the second gain mode being associated with less gain than the threshold.

2. The variable-gain amplifier of claim 1 wherein the switch is coupled in series with the capacitor.

3. The variable-gain amplifier of claim 1 wherein the switch includes at least one of a transistor or a mechanical switch.

4. The variable-gain amplifier of claim 1 wherein the switching-capacitive arm is a first switching-capacitive arm and the degeneration circuit further includes a second switching-capacitive arm coupled in parallel to the inductor.

5. The variable-gain amplifier of claim 1 wherein the gain circuit includes a transistor having a gate or base coupled to an input node and a drain or collector coupled to an output node, and the degeneration circuit is coupled to a source or emitter of the transistor.

6. The variable-gain amplifier of claim 1 wherein the variable-gain amplifier is implemented within a low noise amplifier.

7. The variable-gain amplifier of claim 1 wherein the switch is a transistor.

8. A variable-gain amplifier comprising:
a transistor coupled to an input node and an output node; and
a degeneration circuit coupled to the transistor, the degeneration circuit including an inductor and a capacitive arm coupled in parallel to the inductor, the capacitive arm including a capacitor and a switch, the switch being configurable to an off state for a first gain mode of the variable-gain amplifier and an on state for a second gain mode of the variable-gain amplifier, the first gain mode being associated with more gain than the second gain mode.

9. The variable-gain amplifier of claim 8 wherein the switch is coupled in series with the capacitor.

10. The variable-gain amplifier of claim 8 wherein the switch includes one or more of a transistor or a mechanical switch.

11. The variable-gain amplifier of claim 8 wherein the capacitive arm is a first capacitive arm and the degeneration circuit further includes a second capacitive arm coupled in parallel to the inductor.

12. The variable-gain amplifier of claim 8 wherein the switch is a transistor.

13. A radio-frequency module comprising:
a low noise amplifier configured to amplify a first signal;
a power amplifier configured to amplify a second signal; and
a controller coupled to at least one of the low noise amplifier or the power amplifier, the controller being configured to control a plurality of gain modes for the radio-frequency module, the plurality of gain modes including a first gain mode and a second gain mode;
wherein at least one of the low noise amplifier or the power amplifier includes a transistor and a degeneration circuit coupled to the transistor, the degeneration circuit including an inductor and a capacitive arm coupled in parallel to the inductor, the capacitive arm including a capacitor and a switch, the switch being configurable to an off state for the first gain mode and an on state for the second gain mode, the first gain mode being associated with more gain than a threshold and the second gain mode being associated with less gain than the threshold.

14. The radio-frequency module of claim 13 wherein the controller is configured to control the switch to selectively implement the off state and the on state.

15. The radio-frequency module of claim 13 wherein the switch is coupled in series with the capacitor.

16. The radio-frequency module of claim 13 wherein the switch includes one or more of a transistor or a mechanical switch.

17. The radio-frequency module of claim 13 wherein the capacitive arm is a first switching-capacitive arm and the degeneration circuit further includes a second capacitive arm coupled in parallel to the inductor.

18. A radio-frequency device comprising:
the radio-frequency module of claim 13; and
an antenna configured to receive the first signal and transmit the second signal.

19. The radio-frequency module of claim 13 wherein the switch is a transistor.

\* \* \* \* \*